(12) United States Patent
Winstead et al.

(10) Patent No.: US 8,035,156 B2
(45) Date of Patent: Oct. 11, 2011

(54) SPLIT-GATE NON-VOLATILE MEMORY CELL AND METHOD

(75) Inventors: Brian A. Winstead, Austin, TX (US); Gowrishankar L. Chindalore, Austin, TX (US); Konstantin V. Loiko, Austin, TX (US); Horacio P. Gasquet, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 358 days.

(21) Appl. No.: 12/241,786

(22) Filed: Sep. 30, 2008

(65) Prior Publication Data

US 2010/0078703 A1    Apr. 1, 2010

(51) Int. Cl.
*H01L 29/792* (2006.01)
*H01L 21/8246* (2006.01)
*H01L 21/336* (2006.01)

(52) U.S. Cl. ...................................................... 257/324

(58) Field of Classification Search .......... 257/311–321; 438/257–267, 283, 304, 596, 962, 255, 256, 438/201, 288, 573, 652
See application file for complete search history.

(56) References Cited

U.S. PATENT DOCUMENTS

| | | | |
|---|---|---|---|
| 5,338,952 A | | 8/1994 | Yamauchi |
| 6,069,033 A * | | 5/2000 | Verhaar et al. ................. 438/201 |
| 6,147,379 A * | | 11/2000 | Hori et al. ...................... 257/317 |
| 6,518,619 B2 | | 2/2003 | Verhaar et al. |
| 6,686,622 B2 | | 2/2004 | Noro et al. |
| 6,828,618 B2 | | 12/2004 | Baker, Jr. et al. |
| 6,875,660 B2 * | | 4/2005 | Hung et al. ..................... 438/279 |
| 7,176,083 B2 * | | 2/2007 | Shyu et al. ...................... 438/257 |
| 7,235,848 B2 * | | 6/2007 | Jeng ................................ 257/390 |
| 7,811,886 B2 * | | 10/2010 | Winstead et al. ............... 438/261 |
| 2003/0112660 A1 * | | 6/2003 | Lin et al. .................... 365/185.01 |
| 2003/0157770 A1 | | 8/2003 | Chu et al. |
| 2004/0232470 A1 * | | 11/2004 | Zheng et al. .................... 257/311 |
| 2005/0230736 A1 * | | 10/2005 | Ishimaru et al. ................ 257/314 |
| 2005/0272198 A1 * | | 12/2005 | Hamamura et al. ............ 438/230 |
| 2006/0017056 A1 * | | 1/2006 | Hirler .............................. 257/77 |
| 2006/0244042 A1 * | | 11/2006 | Jeon et al. ....................... 257/315 |
| 2007/0063248 A1 * | | 3/2007 | Shyu et al. ...................... 257/314 |
| 2007/0252190 A1 * | | 11/2007 | Park et al. ....................... 257/315 |
| 2008/0054994 A1 * | | 3/2008 | Shibib et al. ................... 327/538 |
| 2008/0182375 A1 * | | 7/2008 | Rao et al. ........................ 438/267 |
| 2011/0018072 A1 * | | 1/2011 | Lin et al. ......................... 257/410 |

OTHER PUBLICATIONS

U.S. Appl. No. 11/926,323, filed Oct. 29, 2007.
U.S. Appl. No. 11/671,809, filed Feb. 6, 2007.

* cited by examiner

*Primary Examiner* — Dao Nguyen
*Assistant Examiner* — Tram H Nguyen
(74) *Attorney, Agent, or Firm* — Michael J. Balconi-Lamica

(57) ABSTRACT

A method is disclosed for making a non-volatile memory cell on a semiconductor substrate. A select gate structure is formed over the substrate. The control gate structure has a sidewall. An epitaxial layer is formed on the substrate in a region adjacent to the sidewall. A charge storage layer is formed over the epitaxial layer. A control gate is formed over the charge storage layer. This allows for in-situ doping of the epitaxial layer under the select gate without requiring counterdoping. It is beneficial to avoid counterdoping because counterdoping reduces charge mobility and increases the difficulty in controlling threshold voltage. Additionally there may be formed a recess in the substrate and the epitaxial layer is formed in the recess, and a halo implant can be performed, prior to forming the epitaxial layer, through the recess into the substrate in the area under the select gate.

18 Claims, 5 Drawing Sheets

SPLIT-GATE NON-VOLATILE MEMORY CELL AND METHOD

BACKGROUND

1. Field

This disclosure relates generally to memory devices, and more specifically, to a split-gate non-volatile memory cell and method.

2. Related Art

For discrete charge split gate memory, a high select gate (SG) threshold voltage (Vt) is required to control leakage and a low control gate (CG) threshold voltage (Vt) is required to control read disturb. Currently, a relatively high substrate doping is used to raise the SG Vt and counterdoping under the CG is used to lower the CG Vt. However, superposing the p- and n-doping under the CG leads to intrinsic doping fluctuations and degraded mobility.

Stated in a different manner, a P-type well doping has been used to control leakage for unselected bitcells. In addition, a high n-type counterdoping implant has been used to compensate for high background p-type well. However, this leads to degraded read current due to low mobility. This also leads to a degraded Vt-window due to strong intrinsic dopant fluctuations. Furthermore, additional Vt variation occurs due to the counterdoping implant. These aspects create limitations on split-gate thin film storage (TFS) bitcell leakage, read current, and Vt-window.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Several structures and methods are disclosed herein for a split-gate memory cell with an epi-grown region under the control gate. The embodiments advantageously enable for low control gate threshold voltage (CG-Vt) to be achieved with light doping due to no compensation for the p-well in the substrate (i.e., not having to used counterdoping). In addition, the embodiments also advantageously provide for improved mobility and less intrinsic dopant fluctuations. Furthermore, the epi also improves control of doping depth and density, and the epi region may also be recessed or raised to optimize programming and disturb characteristics of the memory. For example, if the epi region is recessed relative the region under the select gate, efficient programming can be provided by ballistic injection of carriers into the nanocrystals. That is, for current flow during programming, one can imagine electrons traveling along and parallel to the select-gate-channel/select-gate-oxide interface. After the electrons pass through the region under the select gate, typically the electrons must be redirected up to go into the nanocrystals which are located above the control-gate-channel/control-gate-oxide interface. Accordingly, with a proper recess of the control gate channel, the nanocrystals can be advantageously disposed directly in the path of the electrons. Accordingly, the electrons can be injected directly into the nanocrystals without changing their trajectory and thus be configured to provide for a more efficient programming. In another embodiment, halo implants after recess formation efficiently dope the source gate (SG) channel, without affecting control gate (CG) channel. Reduced compensation of counterdoping advantageously improves read current, and reduces Vt-width due to less intrinsic dopant fluctuations, as discussed herein.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
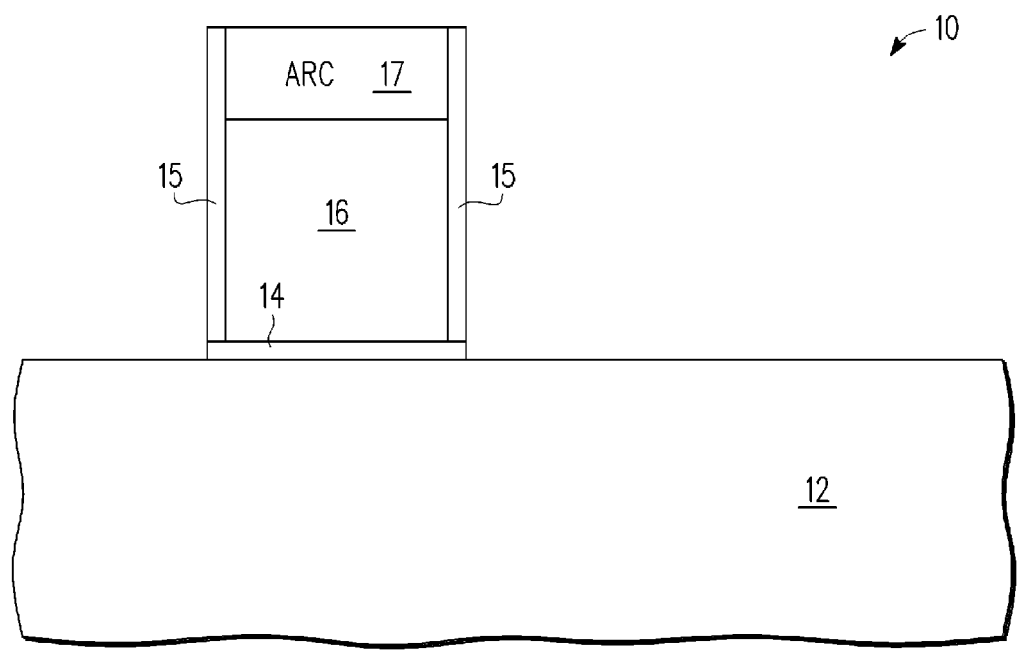
FIGS. 1-4 are cross-sectional views illustrating various stages in a method of making a split-gate non-volatile memory (NVM) device according to one embodiment of the present disclosure.

FIGS. 1-4 are cross-sectional views illustrating various stages in a method of making a split-gate NVM device 10 according to one embodiment of the present disclosure. Turning now to FIG. 1, the method of making a split gate non-volatile memory (NVM) device 10 according to one embodiment begins by providing a semiconductor substrate 12, forming a gate dielectric 14 overlying a surface of substrate 12, and then forming a select gate 16 over the gate dielectric 14. In the formation of the select gate 16, a suitable mask 17 comprising for example, an anti-reflective coating (ARC), is used. In one embodiment, the ARC comprises a nitride, and more particularly, a nitride cap layer. Subsequent to the patterning of the select gate 16, suitable spacers 15 are formed along sidewalls of the select gate 16. In one embodiment, substrate 12, gate dielectric 14, and select gate 16 can comprise any suitable substrate, gate dielectric, and select gate for a given split-gate NVM device implementation. For example, substrate 12 can include a semiconductor substrate with p-type well doping.

Figure 2:
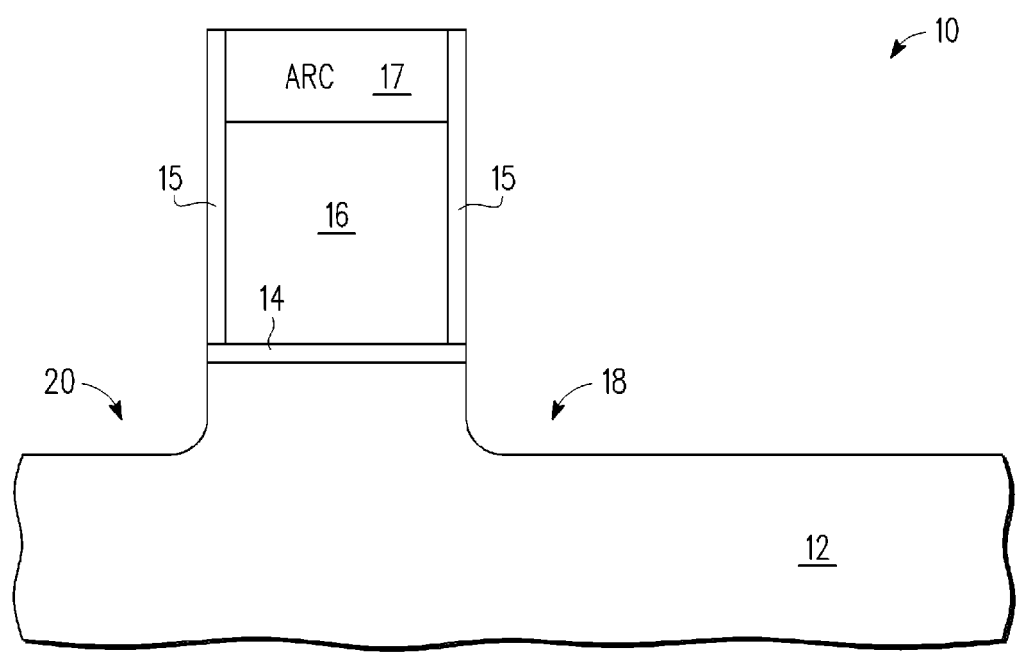

Referring now to FIG. 2, at least one recess (18,20) is formed within substrate 12 adjacent to the select gate 16. In one embodiment, the select gate 16 has a height dimension on the order of 1500 angstroms and the at least on recess (18,20) has a depth on the order of 500 angstroms. The at least one recess (18,20) can be formed using suitable techniques, for example, via etching. In one embodiment, structure 10 includes only one recess (e.g., either one of recess 18 or 20). In another embodiment, structure 10 includes two recesses (e.g., both recesses 18 and 20). In yet another embodiment, structure 10 is free of recesses (i.e., containing no recesses).

Figure 3:
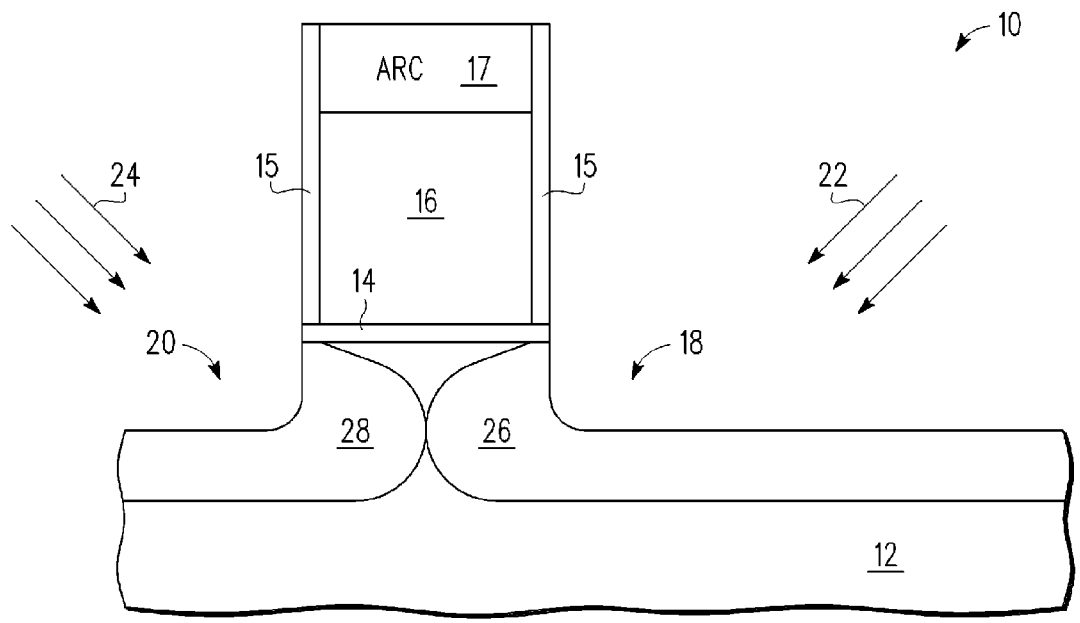

Turning now to FIG. 3, according to one embodiment, the structure 10 is subjected to a halo implant (22,24). The halo implant is adapted to form at least one halo implant region (26,28) within substrate 12, below a portion of the select gate 16, according to the requirements of a given split-gate NVM device implementation. In one embodiment, the structure 10 includes only one halo implant region (e.g., either one of implant region 26 or 28). In another embodiment, the structure 10 includes two halo implant regions (e.g., both implant regions 26 and 28). In yet another embodiment, the structure 10 is free of halo implant regions (i.e., containing no halo implant regions).

Figure 4:
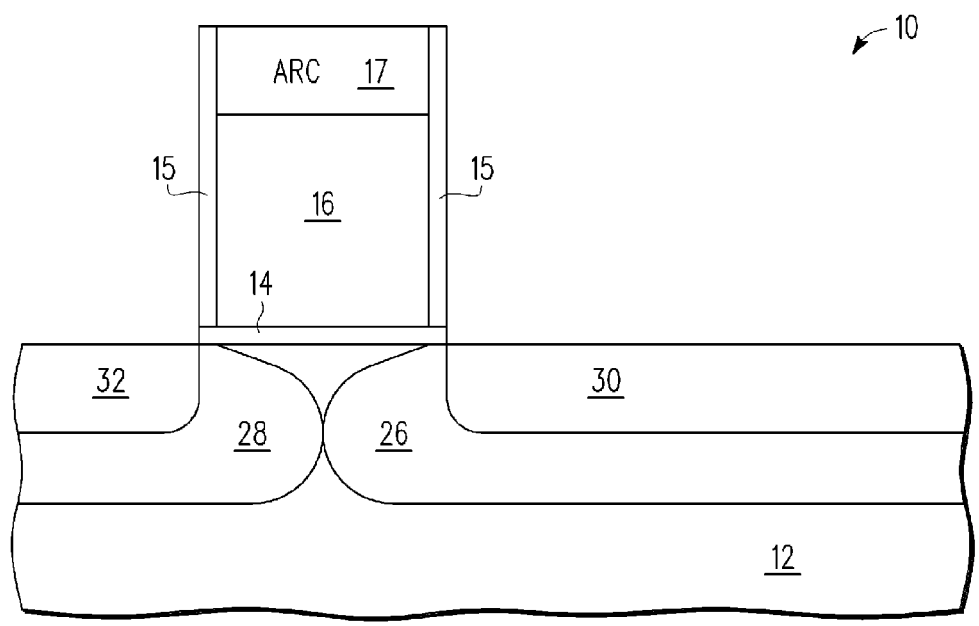

Referring now to FIG. 4, at least one epitaxial layer (30,32) is grown within a corresponding at least one recess (18,20). In one embodiment, the at least one epitaxial layer (30,32) is in-situ doped with a dopant of a conductivity type different from the conductivity type of the substrate 12. Preferably, the at least one epitaxial layer (30,32) is not a counter-doped epitaxial layer. For example, in one embodiment, substrate 12 comprises a p-type substrate, and the at least one epitaxial layer (30,32) comprises an n-type doped epitaxial layer. In one embodiment, structure 10 includes only one epitaxial layer (e.g., one of epitaxial layer 30 or 32), wherein only one recess (18 or 20) was provided. In another embodiment, structure 10 includes two epitaxial layers (e.g., both epitaxial layers 30 and 32), wherein both recesses 18 and 20 were provided. In yet another embodiment, the epitaxial layer is not contained within a recess within the substrate, but rather is disposed on a surface of the substrate 12, as will be discussed herein with reference to FIGS. 8 and 9. In yet another embodiment, the epitaxial layer 30 is in-situ doped with a dopant of one selected from the group consisting of (i) a conductivity type opposite to a conductivity type of substrate 12 and (ii) a same conductivity type as substrate 12, but with a concentration one order of magnitude lower, sufficient for enabling a threshold voltage Vt of the control gate to be significantly different from a threshold voltage Vt of the select gate.

Figure 5:
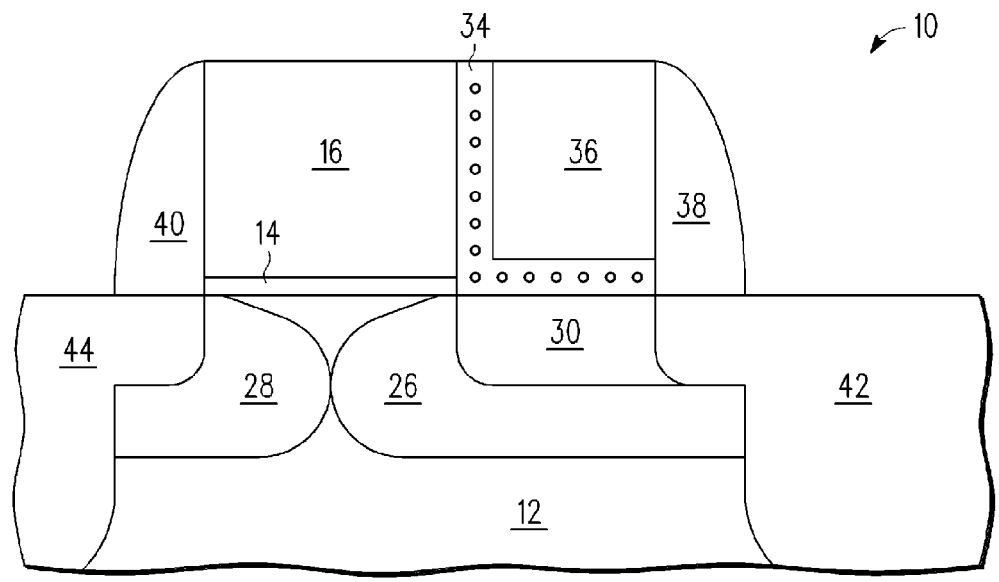
FIG. 5 is a cross-sectional view of a split-gate NVM device according to one embodiment of the present disclosure.

FIG. 5 is a cross-sectional view of a split-gate NVM device 10 according to one embodiment of the present disclosure. Subsequent to the formation of the epitaxial layer 30, a control gate stack is formed, using suitable techniques known in the art. For example, formation of the control gate stack can include forming a charge storage layer 34, followed by formation of a control gate 36. Following formation of the control gate 36, sidewall spacers (38,40) and source/drain implant regions (42,44) are formed using suitable techniques. Charge storage layer 34 can include any suitable discrete charge storage layer, for example, a nanocrystal charge storage layer or a nitride charge storage layer, selected according to the requirements of a given split-gate NVM device implementation. In addition, the thickness of charge storage layer 34 is determined according to the requirements of a given split-gate NVM memory device, to provide a desired spacing between the select gate 16 and the control gate 36.

Figure 6:
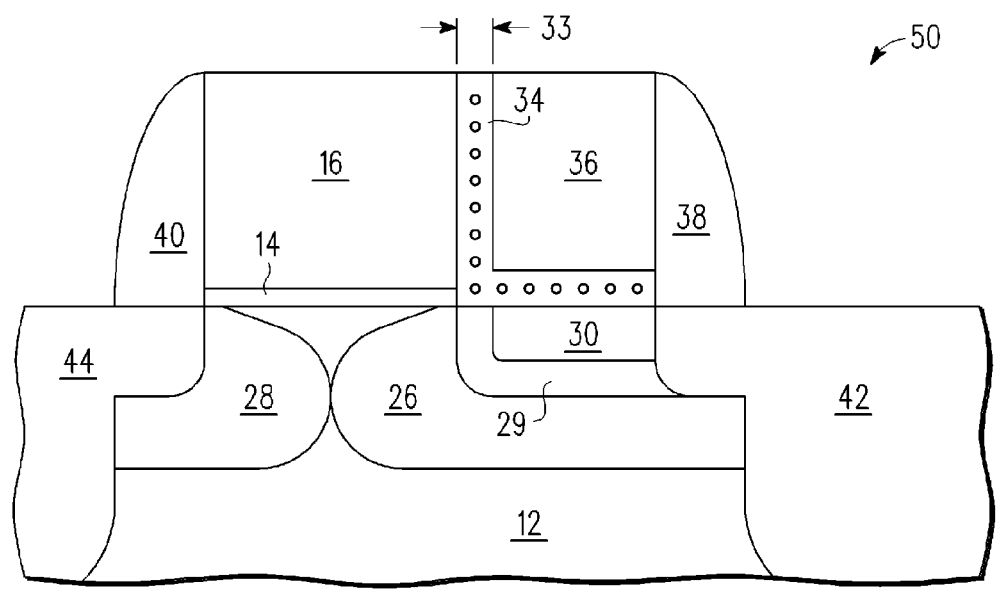
FIG. 6 is a cross-sectional view of a split-gate NVM device according to another embodiment of the present disclosure.

FIG. 6 is a cross-sectional view of a split-gate NVM device 50 according to another embodiment of the present disclosure. The embodiment of FIG. 6 is similar to that of FIG. 5 with the following differences. Subsequent the formation of the at least one recess (18,20) of FIG. 2, and subsequent to the at least one halo implants (26,28) of FIG. 3, the epitaxial layer formation is a follows. At least one highly doped epitaxial layer 29 is formed within a corresponding recess, immediately prior to formation of the at least one epitaxial layer (30,32). The thickness of the at least one highly doped epitaxial layer 29 is selected according to the requirements of a desired doping gap region of the channel of the NVM device 50. As illustrated in FIG. 6, the width 33 of the charge storage layer 34 corresponds to a gap or spacing between the select gate 16 and the control gate 36. With respect to the desired doping gap region of the channel created by the at least one highly doped epitaxial layer 29, the doping gap region dimension can be on the order of gap 33 or larger. In one embodiment, gap doping advantageously provides for elimination of gap charge and gap nanocrystal effects. In addition, tailoring of the lateral field profile can be used for optimizing a programming of the split-gate NVM device. Furthermore, the at least one highly doped epitaxial layer 29 is in-situ doped with a higher concentration of dopant of a same conductivity type as the at least one epitaxial layer (30,32). For example, in one embodiment, substrate 12 comprises a P-well doped semiconductor substrate, the at least one epitaxial layer (30,32) comprises an N doped epitaxial layer, and the at least one highly doped epitaxial layer 29 comprises an N+ doped epitaxial layer. Exemplary dopant concentrations can include, for example, 5e17 for the P-well doped substrate 12, 1e18 for the epi layer 29, and 1e17 for the epi layer 30. In another embodiment, the epitaxial layers 29 and 30 are both in-situ doped with a dopant of one selected from the group consisting of (i) a conductivity type opposite to a conductivity type of substrate 12 and (ii) a same conductivity type as substrate 12, but with concentrations at least one order of magnitude lower, sufficient for enabling a threshold voltage Vt of the control gate to be different from a Vt of the select gate.

Referring still to FIG. 6, subsequent to the formation of the epitaxial layers 29 and 30, a control gate stack is formed, using suitable techniques known in the art. For example, formation of the control gate stack can include forming a charge storage layer 34, followed by formation of a control gate 36. Following formation of the control gate 36, sidewall spacers (38,40) and source/drain implant regions (42,44) are formed using suitable techniques.

Figure 7:
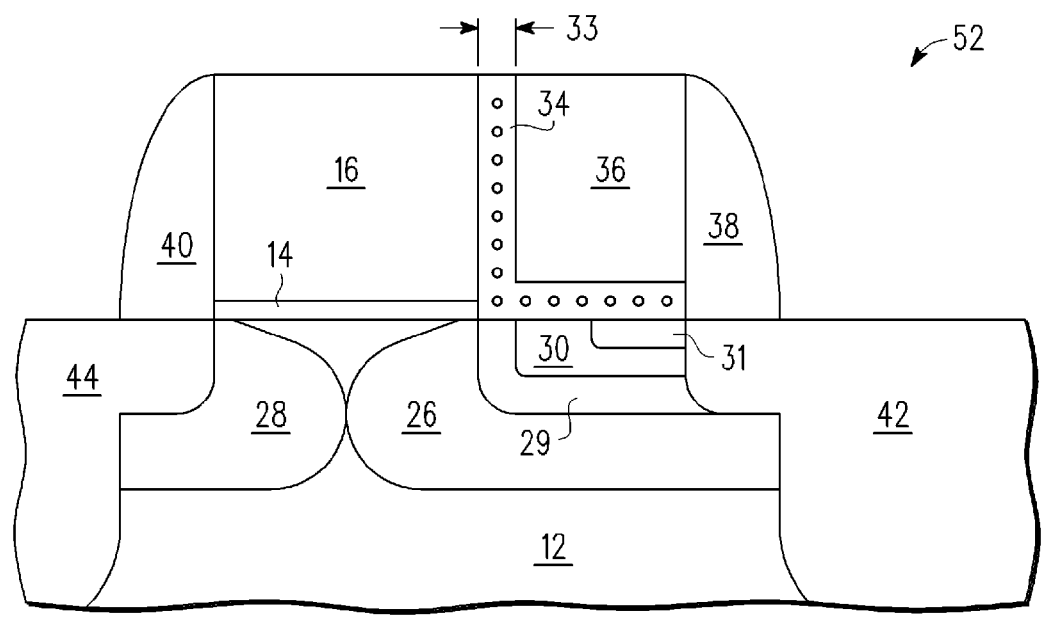
FIG. 7 is a cross-sectional view of a split-gate NVM device according to yet another embodiment of the present disclosure.

FIG. 7 is a cross-sectional view of a split-gate NVM device 52 according to yet another embodiment of the present disclosure. The embodiment of FIG. 7 is similar to that of FIG. 6 with the following differences. Subsequent the formation of the at least one highly doped epitaxial layer 29 within a corresponding recess, the formation of the at least one epitaxial layer (30,32) is modified as follows. In particular, a junction is formed within at least one epitaxial layer. The junction is formed by (i) initially forming epitaxial layer 30 using in-situ doping with a first conductivity type dopant, (ii) stopping the use of the first conductivity type dopant, and (iii) changing the conductivity type of in-situ doping by using a dopant of opposite conductivity type while continuing to form an epitaxial layer. The portion of the epitaxial layer corresponding to the dopant of opposite conductivity type is represented by reference numeral 31. The junction created by regions 30 and 31 provides an ability to modify threshold voltage characteristics of the control gate 36 of the split-gate NVM device 52. In addition, tailoring of the lateral field profile can advantageously provide for optimization of programming of the split-gate NVM device. In one embodiment, substrate 12 comprises a P doped substrate, the at least one epitaxial layer (30,32) comprises an N doped epitaxial layer, the at least one highly doped epitaxial layer 29 comprises an N+ doped epitaxial layer, and the epitaxial layer 31 comprises a P doped epitaxial layer. Exemplary dopant concentrations can include, for example, 5e17 for the P-well doped substrate 12, 1e18 for the epi layer 29, and 1e17 for the epi layer 30, and 1e17 for epi layer 31. In yet another embodiment, split-gate NVM device 52 can be fabricated without epi layer 29. In other words, device 52 can include epi layers 30 and 31, but may not include epi layer 29.

Figure 8:
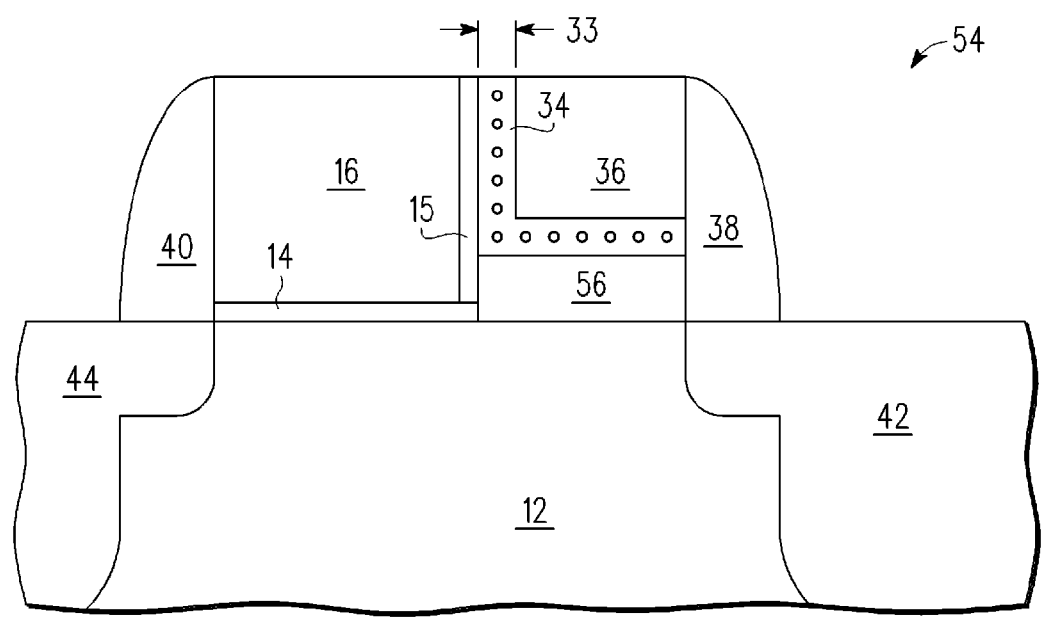
FIG. 8 is a cross-sectional view of a split-gate NVM device according to another embodiment of the present disclosure.

FIG. 8 is a cross-sectional view of a split-gate NVM device 54 according to another embodiment of the present disclosure. The embodiment of FIG. 8 is similar to that of FIG. 5 with the following differences. The embodiment of FIG. 8 does not include the formation of the at least one recess (18,20) of FIG. 2 and does not include the at least one halo implants (26,28) of FIG. 3. Subsequent to formation of the structure of FIG. 1, at least one epitaxial layer 56 is formed on the surface of substrate 12 adjacent to select gate 16. During formation of the epitaxial layer 56, the liner 15 as shown in FIG. 8, remains on select gate 16. In addition, the at least one epitaxial layer 56 is formed with a thickness selected according to the requirements of given split-gate NVM device 50. The at least one epitaxial layer 56 is in-situ doped with a dopant of a conductivity type opposite to a conductivity type of substrate 12. For example, in one embodiment, substrate 12 comprises a P doped substrate and the at least one epitaxial layer 56 comprises an N doped epitaxial layer. Exemplary dopant concentrations can include, for example, 5e17 for the P-well doped substrate 12 and 1e17 for the epi layer 56. In yet another embodiment, split-gate NVM device 54 can be fabricated with one or more additional regions within epi layer 56, similar to epi layers 29 and 31 of FIGS. 6 and 7.

Referring still to FIG. 8, subsequent to the formation of the epitaxial layer 56, a control gate stack is formed, using suitable techniques known in the art. For example, formation of the control gate stack can include forming a charge storage layer 34, followed by formation of a control gate 36. Following formation of the control gate 36, sidewall spacers (38,40) and source/drain implant regions (42,44) are formed using suitable techniques.

Figure 9:
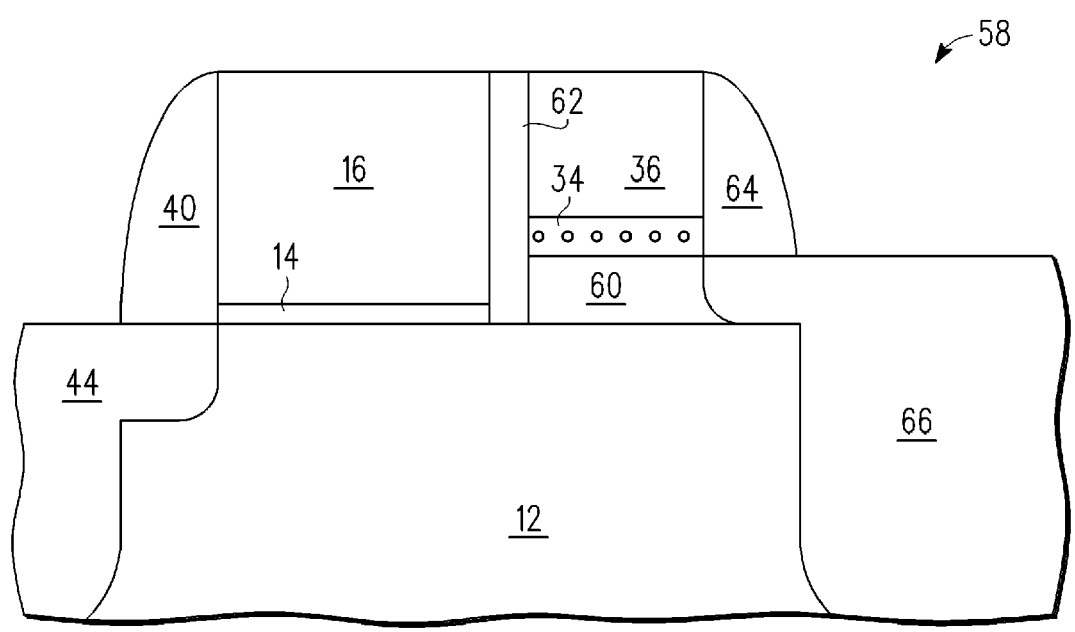
FIG. 9 is a cross-sectional view of a split-gate NVM device according to still another embodiment of the present disclosure.

FIG. 9 is a cross-sectional view of a split-gate NVM device 56 according to still another embodiment of the present disclosure. The embodiment of FIG. 9 is similar to that of FIG. 5 with the following differences. The embodiment of FIG. 9 does not include the formation of the at least one recess (18,20) of FIG. 2 and does not include the at least one halo implants (26,28) of FIG. 3. Prior to formation of the structure of FIG. 1, an epitaxial layer 60 is formed overlying the substrate 12. The epitaxial layer 60 is formed with a thickness selected according to the requirements of given split-gate NVM device 58. The epitaxial layer 60 is in-situ doped with a dopant of one selected from the group consisting of (i) a conductivity type opposite to a conductivity type of substrate 12 and (ii) a same conductivity type as substrate 12, but with a concentration on the order of a magnitude lower, sufficient for enabling a threshold voltage Vt of the control gate to be different from a Vt of the select gate. In addition, an insulative spacer 62 provides a desired spacing between the select gate 16 and the control gate 36, according to the requirements of a given split-gate NVM device implementation. In one embodiment, exemplary dopant concentrations can include, for example, 5e17 for the P-well doped substrate 12 and 1e17 for the epi layer 60. In yet another embodiment, split-gate NVM device 56 can be fabricated with one or more additional regions within epi layer 60, similar to epi layers 29 and 31 of FIGS. 6 and 7.

Referring still to FIG. 9, subsequent to the formation of the epitaxial layer 60 and the control gate stack, a select gate stack is formed, using suitable techniques known in the art. For example, formation of the control gate stack can include forming a charge storage layer 34, followed by formation of a control gate 36. Following formation of the select gate 16, sidewall spacers (64,40) and source/drain implant regions (66,44) are formed using suitable techniques.

The embodiments of the present disclosure advantageously provide for a higher read current, larger Vt-window, improved disturb characteristics, and improved control of leakage for split-gate thin film storage (SG-TFS) devices.

By now it should be appreciated that there has been provided a method of making a non-volatile memory cell on a semiconductor substrate, the method comprising: forming a select gate structure over the substrate wherein the select gate structure has a first sidewall; and growing a first epitaxial layer on the substrate in a region adjacent to the first sidewall; forming a charge storage layer over the first epitaxial layer; and forming a control gate over the charge storage layer. The method further includes forming a completed select gate from the select gate structure, wherein the select gate has a second sidewall. The method further comprises forming a first source/drain adjacent to the second sidewall and a second source/drain adjacent to a side of the select gate that is away from the first sidewall.

According to another embodiment, the method of as indicated above, wherein the semiconductor substrate has a first conductivity type, and wherein the step of growing the epitaxial layer includes in-situ doping to a second conductivity type. In another embodiment, the method also includes forming a first recess in the semiconductor substrate adjacent to the first sidewall, wherein the step of growing the first epitaxial layer is further characterized as growing the first epitaxial layer in the first recess. In a still further embodiment, the method includes performing a halo implant into a region of the substrate under the select gate structure after forming the first recess and before forming the first epitaxial layer. In addition, the semiconductor substrate has a first conductivity type, and wherein the step of growing the epitaxial layer includes in-situ doping to a second conductivity type. Furthermore, the step of in-situ doping can comprise initially in-situ doping to a first concentration followed by in-situ doping to a second concentration wherein the first concentration is greater than the second concentration. Moreover, in a further embodiment, the step of growing the first epitaxial layer is further characterized as in-situ doping to the first conductivity type after in-situ doping to the second concentration.

According to yet another embodiment, the method includes wherein the step of forming the epitaxial layer is further characterized by the epitaxial layer being formed to be of the same semiconductor material as the semiconductor substrate. In addition, the step of forming the charge storage layer is further characterized by the charge storage layer comprising a nanocrystal layer.

In yet another embodiment, the step of forming the select gate structure is further characterized as forming the select gate to have the first sidewall and a second sidewall; the step of forming the first recess further comprises forming a second recess in the semiconductor substrate adjacent to the second sidewall; and the step of growing the first epitaxial layer further comprises growing a second epitaxial layer in the second recess. In addition, the method further comprises performing a halo implant through the first recess and the second recess and into a region of the substrate under the select gate after forming the first recess and the second recess and before forming the first epitaxial layer and the second epitaxial layer.

According to another embodiment, the method of forming a non-volatile memory cell, comprises: forming a select gate over a substrate; forming a first recess in the substrate one on a first side of the select gate and a second recess in the substrate on a second side of the select gate; growing a first epitaxial region in the first recess and a second epitaxial region in the second recess; forming a charge storage layer over the second epitaxial region; and forming a control gate over the charge storage layer. In addition, the method may further comprise performing a halo implant into the substrate under the select gate after the step of forming the first recess and before the step of growing. Furthermore, the method can further include wherein the substrate is further characterized as having a background doping of the first conductivity type and wherein the step of growing is further characterized as including in-situ-doping to a second conductivity type. The step of growing is further characterized by the first epitaxial region having a semiconductor content which is only silicon and the semiconductor substrate is further characterized by having a semiconductor content which is only silicon. In yet another embodiment, the substrate is further characterized as having a background doping of the first conductivity type and wherein the step of growing is further characterized as including in-situ-doping to a second conductivity type.

According to a still further embodiment, a non-volatile memory cell, comprises: a select gate over a first portion of a semiconductor substrate; a charge storage layer over a first semiconductor region, wherein the first semiconductor region is over a second portion of the semiconductor substrate; and a control gate over the charge storage layer, wherein the semiconductor substrate has a background doping of a first conductivity type, and a portion of the first semiconductor region has dopants of only a second conductivity type. In another embodiment, the first semiconductor region is in a recess of the semiconductor substrate.

Because the apparatus implementing the present invention is, for the most part, composed of components and circuits known to those skilled in the art, certain details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types, skilled artisans appreciate that conductivity types may be reversed, or may be of the same conductivity type but with different concentrations.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the embodiments of the present disclosure can be applicable to nanocrystal memory (SG-TFS) devices for use in consumer and automotive applications. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a non-volatile memory cell on a semiconductor substrate, comprising:
   forming a select gate structure over the substrate wherein the select gate structure has a first sidewall; and
   growing a first epitaxial layer on the substrate in a region adjacent to the first sidewall, wherein said growing the first epitaxial layer is performed subsequent to said forming the select gate structure;
   forming a charge storage layer over the first epitaxial layer; and
   forming a control gate over the charge storage layer.

2. The method of claim 1, forming a completed select gate from the select gate structure, wherein the select gate has a second sidewall.

3. The method of claim 2, further comprising forming a first source/drain adjacent to the second sidewall and a second source/drain adjacent to a side of the select gate that is away from the first sidewall.

4. The method of claim 1, wherein the semiconductor substrate has a first conductivity type, and wherein the step of growing the epitaxial layer includes in-situ doping to a second conductivity type.

5. The method of claim 1, further comprising forming a first recess in the semiconductor substrate adjacent to the first sidewall, wherein the step of growing the first epitaxial layer is further characterized as growing the first epitaxial layer in the first recess.

6. The method of claim 5, further comprising performing a halo implant into a region of the substrate under the select gate structure after forming the first recess and before forming the first epitaxial layer.

7. The method of claim 5, wherein the semiconductor substrate has a first conductivity type, and wherein the step of growing the epitaxial layer includes in-situ doping to a second conductivity type.

8. The method of claim 7, wherein the step of in-situ doping comprises initially in-situ doping to a first concentration followed by in-situ doping to a second concentration wherein the first concentration is greater than the second concentration.

9. The method of claim 8, wherein the step of growing the first epitaxial layer is further characterized as in-situ doping to the first conductivity type after in-situ doping to the second concentration.

10. The method of claim 5, wherein the step of forming the epitaxial layer is further characterized by the epitaxial layer being formed to be of the same semiconductor material as the semiconductor substrate.

11. The method of claim 5, wherein the step of forming the charge storage layer is further characterized by the charge storage layer comprising a nanocrystal layer.

12. The method of claim 5, wherein:
   the step of forming the select gate structure is further characterized as forming the select gate to have the first sidewall and a second sidewall;
   the step of forming the first recess further comprises forming a second recess in the semiconductor substrate adjacent to the second sidewall; and
   the step of growing the first epitaxial layer further comprises growing a second epitaxial layer in the second recess.

13. The method of claim 12 further comprising performing a halo implant through the first recess and the second recess and into a region of the substrate under the select gate after forming the first recess and the second recess and before forming the first epitaxial layer and the second epitaxial layer.

14. A method of forming a non-volatile memory cell, comprising:
   forming a select gate over a substrate;
   forming a first recess in the substrate one on a first side of the select gate and a second recess in the substrate on a second side of the select gate;
   growing a first epitaxial region in the first recess and a second epitaxial region in the second recess;
   forming a charge storage layer over the second epitaxial region; and
   forming a control gate over the charge storage layer.

15. The method of claim 14, further comprising performing a halo implant into the substrate under the select gate after the step of forming the first recess and before the step of growing.

16. The method of claim 15, wherein the substrate is further characterized as having a background doping of the first conductivity type and wherein the step of growing is further characterized as including in-situ-doping to a second conductivity type.

17. The method of claim 16, wherein the step of growing is further characterized by the first epitaxial region having a semiconductor content which is only silicon and the semiconductor substrate is further characterized by having a semiconductor content which is only silicon.

18. The method of claim 14, wherein the substrate is further characterized as having a background doping of the first conductivity type and wherein the step of growing is further characterized as including in-situ-doping to a second conductivity type.

* * * * *